(12) United States Patent
Haba et al.

(10) Patent No.: US 7,351,641 B2
(45) Date of Patent: Apr. 1, 2008

(54) STRUCTURE AND METHOD OF FORMING CAPPED CHIPS

(75) Inventors: Belgacem Haba, Saratoga, CA (US);
Masud Beroz, Livermore, CA (US);
Glenn Urbish, Coral Springs, FL (US);
David B. Tuckerman, Orinda, CA (US)

(73) Assignee: Tessera, Inc., San Jose, CA (US)

( * ) Notice: Subject to any disclaimer, the term of this patent is extended or adjusted under 35 U.S.C. 154(b) by 39 days.

(21) Appl. No.: 11/201,726

(22) Filed: Aug. 11, 2005

(65) Prior Publication Data
US 2006/0033189 A1 Feb. 16, 2006

Related U.S. Application Data

(60) Provisional application No. 60/600,908, filed on Aug. 12, 2004.

(51) Int. Cl.
*H01L 21/76* (2006.01)
*H01L 21/30* (2006.01)

(52) U.S. Cl. ............. 438/411; 438/456; 438/458; 438/461; 257/704; 257/23.181

(58) Field of Classification Search ............... 438/411, 438/456, 461, 458, 611; 257/704, 728, E23.181
See application file for complete search history.

(56) References Cited

U.S. PATENT DOCUMENTS

| | | | |
|---|---|---|---|
| 4,213,104 A | | 7/1980 | Cullen et al. |
| 5,694,300 A | * | 12/1997 | Mattei et al. .......... 361/818 |
| 6,064,286 A | * | 5/2000 | Ziegner et al. ......... 333/247 |
| 6,186,008 B1 | | 2/2001 | Janczek et al. |
| 6,297,072 B1 | * | 10/2001 | Tilmans et al. ........ 438/106 |
| 6,750,521 B1 | | 6/2004 | Chilcott et al. |
| 6,890,834 B2 | * | 5/2005 | Komobuchi et al. ..... 438/455 |
| 2002/0192920 A1 | | 12/2002 | Song |

(Continued)

FOREIGN PATENT DOCUMENTS

DE   195 48 050 A1   6/1997

(Continued)

OTHER PUBLICATIONS

Internationa Search Report, PCT/US05/028492, Dated Nov. 8, 2005.

(Continued)

*Primary Examiner*—Nitin Parekh
(74) *Attorney, Agent, or Firm*—Lerner, David, Littenberg, Krumholz & Mentlik, LLP

(57) ABSTRACT

As disclosed herein, structures and methods are provided for forming capped chips. As provided by the disclosed method, a metal base pattern is formed on a chip insulated from wiring of the chip, and a cap is formed including a metal. The cap is joined to the metal base pattern on the chip to form the capped chip. In one embodiment, a front surface of the chip is exposed which extends from a contact of the chip to an edge of the chip. In another embodiment, a conductive connection is formed to the contact, the conductive connection extending from the contact to a terminal at an exposed plane above the front surface of the chip.

18 Claims, 14 Drawing Sheets

U.S. PATENT DOCUMENTS

2003/0206083 A1 11/2003 Takahashi et al.
2004/0108588 A1 6/2004 Gilleo

FOREIGN PATENT DOCUMENTS

| DE | 102 06 919 A1 | 8/2003 |
| EP | 1 433 742 A | 6/2004 |
| JP | 09 008596 | 5/1997 |
| WO | WO-03/084861 A | 10/2003 |

OTHER PUBLICATIONS

International Search Report, PCT/US2005/028492, Dated Mar. 2, 2006.

* cited by examiner

STRUCTURE AND METHOD OF FORMING CAPPED CHIPS

CROSS-REFERENCE TO RELATED APPLICATIONS

This application claims the benefit of the filing date of U.S. Provisional Patent Application No. 60/600,908 filed Aug. 12, 2004, the disclosure of which is hereby incorporated herein by reference.

BACKGROUND OF THE INVENTION

The present invention relates to microelectronic packaging.

Electronic devices referred to as surface acoustic wave or "SAW" devices process electronic signals in the form of acoustical waves, i.e., minute mechanical vibrations transmitted within the device, typically on an exposed surface region of a mass of a crystalline material. SAW devices are used, for example, as frequency-selective filters and as mixers in analog signal processing. Among other applications, SAW devices are used in radio frequency circuits of cellular telephones and other portable electronic apparatus. SAW devices normally must be provided with a cover or "cap" overlying the acoustically-active region of the surface to protect the active surface from mechanical engagement with surrounding structures and from chemical reaction with the surrounding atmosphere. Likewise, certain micro-electromechanical devices and micro machines incorporate microscopic mechanical elements within an active region of the device. The active regions of these devices must be covered by caps to protect the micromechanical elements. Such devices typically are formed using techniques commonly employed to make conventional microelectronic devices, and are commonly referred to by the acronym "MEMS." Voltage controlled oscillators (VCOs) sometimes also require a cap to be placed over the active area.

Miniature SAW devices can be made in the form of a wafer formed from or incorporating an acoustically active material such as lithium niobate material. The wafer is treated to form a large number of SAW devices, and typically also is provided with electrically conductive contacts used to make electrical connections between the SAW device and other circuit elements. After such treatment, the wafer is severed to provide individual devices. SAW devices fabricated in wafer form have been provided with caps while still in wafer form, prior to severing. For example, as disclosed in U.S. Pat. No. 6,429,511 a cover wafer formed from a material such as silicon can be treated to form a large number of hollow projections and then bonded to the top surface of the active material wafer, with the hollow projections facing toward the active wafer. After bonding, the cover wafer is polished to remove the material of the cover wafer down to the projections. This leaves the projections in place as caps on the active material wafer, and thus forms a composite wafer with the active region of each SAW device covered by a cap.

Such a composite wafer can be severed to form individual units. The units obtained by severing such a wafer can be mounted on a substrate such as a chip carrier or circuit panel and electrically connected to conductors on the substrate by wire-bonding to the contacts on the active wafer after mounting, but this requires that the caps have holes of a size sufficient to accommodate the wire bonding process. This increases the area of active wafer required to form each unit, requires additional operations and results in an assembly considerably larger than the unit itself.

In another alternative disclosed by the '511 patent, terminals can be formed on the top surfaces of the caps and electrically connected to the contacts on the active wafer prior to severance as, for example, by metallic vias formed in the cover wafer prior to assembly. However, formation of terminals on the caps and vias for connecting the terminals to the contacts on the active wafer requires a relatively complex series of steps.

Similar problems occur in providing terminals for MEMS devices. For these and other reasons, further improvements in processes and structures for SAW, MEMS and other capped devices would be desirable.

SUMMARY OF THE INVENTION

According to an aspect of the invention, a method is provided for forming a capped chip. The method includes forming a metal base pattern on a front surface of a chip. A cap including a metal is joined to the metal base pattern on the chip to form a capped chip. According to such aspect, the front surface of the chip remains uncovered by the cap from at least a contact of the chip to a peripheral edge of the chip.

According to another aspect of the invention, a method of forming a capped chip is provided in which the cap is included in a microelectronic substrate. According to such aspect, a chip is provided having a front surface, a rear surface, and peripheral edges extending between the front and rear surfaces, and a metal base pattern disposed on the front surface. A microelectronic substrate including a cap is then joined to the metal base pattern to form a capped chip. According to such aspect, a front surface of the microelectronic substrate faces the front surface of the chip and extends beyond at least one the peripheral edge, whereby a terminal of the microelectronic substrate is not covered by the chip.

According to another aspect of the invention, a method is provided of forming a capped chip in which a cap is formed from a metal covered depression of a dielectric panel. According such aspect of the invention, a dielectric panel is provided having a first layer of metal disposed on a first side thereof, a depression on a second side thereof and a second layer of metal over the depression on the second side. The cap is joined to a chip to form a capped chip, wherein the metal covered depression defines a cavity facing the chip.

According to another aspect of the invention, a method is provided of forming a plurality of capped chips. According to such aspect of the invention, a plurality of chips are provided, arranged in an array, each chip having a front surface and a metal base pattern and a contact on the front surface. A cap frame is provided including an array of caps, each including a metal. The array of caps is joined to the metal base patterns of the plurality of chips to form capped chips, wherein a front surface of each chip remains uncovered by the cap joined to the chip from at least the contact of the chip to a peripheral edge of the chip.

According to yet another aspect of the invention, a method of forming a plurality of capped chips is provided in which an array of chips is provided, each chip having a front surface, a rear surface, and peripheral edges extending between the front and rear surfaces, and a metal base pattern disposed on the front surface. An array of microelectronic substrates, each including a cap, is joined to the metal base patterns to form an array of capped chips, such that a front surface of each the microelectronic substrate faces the front surface of each chip and extends beyond at least one peripheral edge of the chip.

According to yet another aspect of the invention, a method of forming a capped chip is provided in which a chip has a front surface, and a metal base pattern and a contact on the front surface. A cap substrate is provided which has a top surface and a bottom surface, a cap metal on the top surface, and at least one conductive connector exposed at the top surface and the bottom surface. The cap metal of the cap substrate is simultaneously bonded to the metal base pattern when the conductive connector is bonded to the contact of the chip to form a capped chip having a conductive connector exposed at the bottom surface of the cap substrate.

According to yet another aspect of the invention, a capped chip is provided which includes a chip having a front surface including wiring, a metal base pattern insulated from the wiring, and an active area. According to such aspect, the front surface of the chip extends between a first edge of the chip and a second edge of the chip opposite the first edge. A cap including a metal layer is joined to the chip, wherein the front surface is exposed between a contact of the chip and at least the first edge of the chip.

According to yet another aspect of the invention, a capped chip is provided which includes a chip having a metal base pattern on a front surface thereof. A microelectronic substrate having a cap metal pattern is joined to the metal base pattern of the chip in such way that the microelectronic substrate extends beyond at least one peripheral edge of the front surface of the chip. The front surface of the microelectronic substrate remains uncovered by the chip from at least a terminal to a peripheral edge of the microelectronic substrate.

According to still another aspect of the invention, a capped chip is provided in which the chip has a front surface, a metal base pattern and a contact on the front surface. A cap substrate is provided having a top surface and a bottom surface, a cap metal on the top surface, and at least one conductive connector exposed at the top surface and the bottom surface. According to such aspect, the cap metal is bonded to the metal base pattern and the conductive connector is bonded to the contact such that the conductive connector is exposed at the bottom surface of the cap substrate.

BRIEF DESCRIPTION OF THE DRAWINGS

FIGS. 3-10A are cross-sectional views illustrating stages in a process of fabricating a capped chip according to a first embodiment of the invention.

FIGS. 17-25A are views illustrating stages in a fabrication process according to a third embodiment of the invention.

DETAILED DESCRIPTION

In the embodiments described herein, reference is made to the fabrication of a cap and the joining of the cap to a chip to form a capped chip having a cavity over an area of the chip. For example, a cap 112 can be joined as a cover element for hermetically sealing an active area of a surface acoustic wave (SAW) chip. Alternatively, in another type of chip, the active area may include other features requiring a sealed cavity, such as microelectromechanical devices (MEMs). As another alternative, a sealed cavity may be needed to enclose an "air dielectric" having exposed conductors which are isolated from one another by vacuum or air spaces separating individual conductors.

The description that follows should be understood to include the simultaneous fabrication of multiple caps arranged in an array, and the simultaneous joining of the caps to multiple chips, arranged in an array on a wafer or sub portion thereof. The multiple chips are simultaneously aligned to the multiple caps, prior to the joining the chips to the caps. Thereafter, the multiple capped chips are severed from each other, as by dicing. Further, the terms "edge" and "peripheral edge", used herein in relation to a chip, shall be understood to mean the peripheral boundary of the front surface of a chip, i.e., the actual boundary of the chip when it has already been severed from other chips, or when the chip has not yet been severed, the implicit boundary, i.e., the line on which the chip will be severed.

Figure 1:
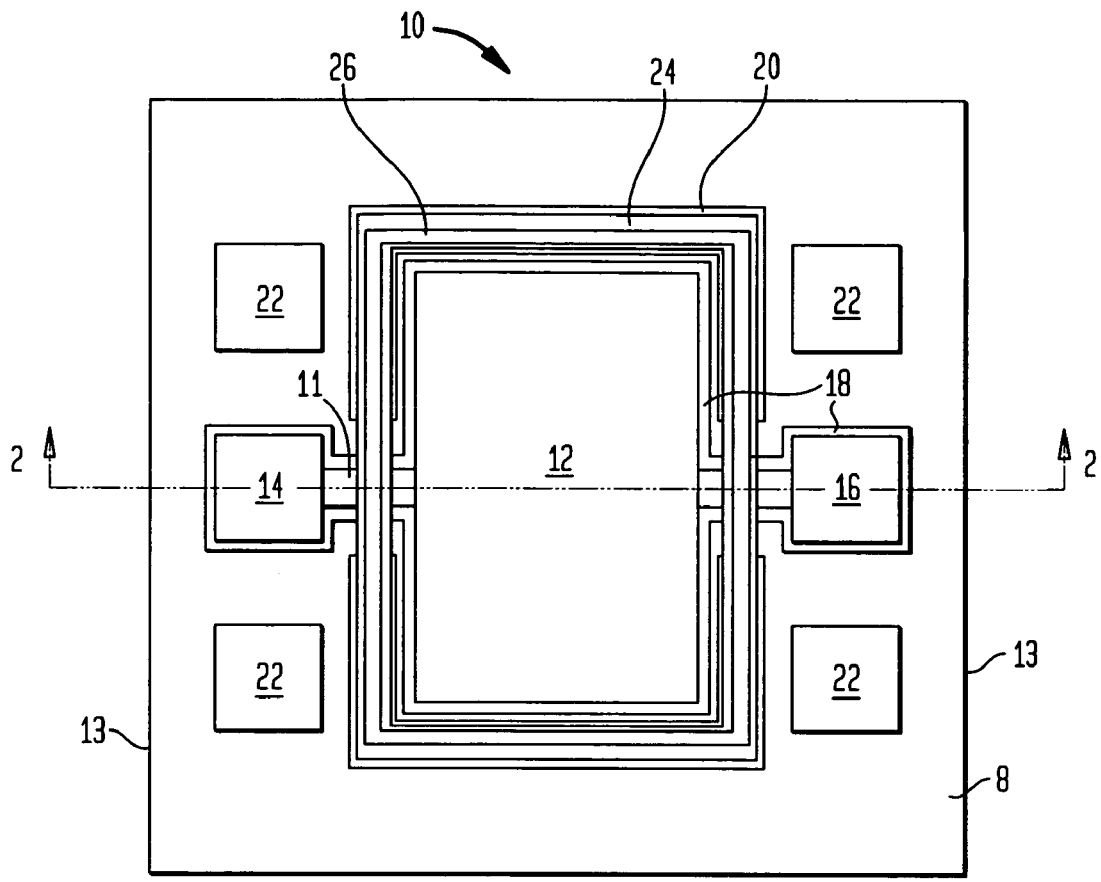
FIG. 1 is a plan view illustrating structure of a surface acoustic wave (SAW) chip.
Figure 2:
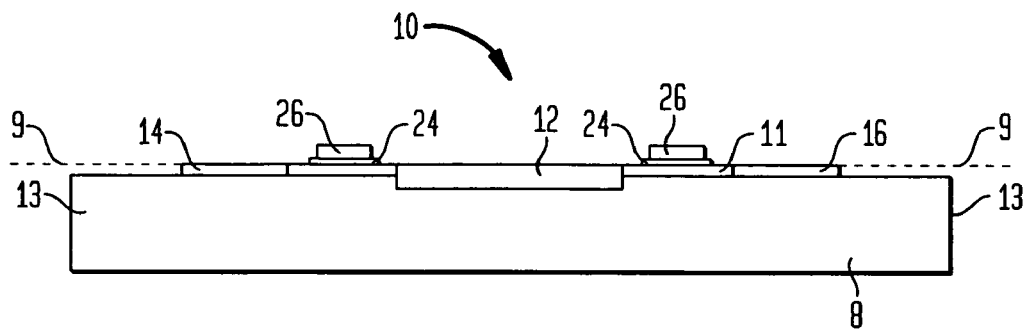
FIG. 2 is a cross-sectional view, through lines 2-2, of the SAW chip illustrated in FIG. 1.
Figure 3:
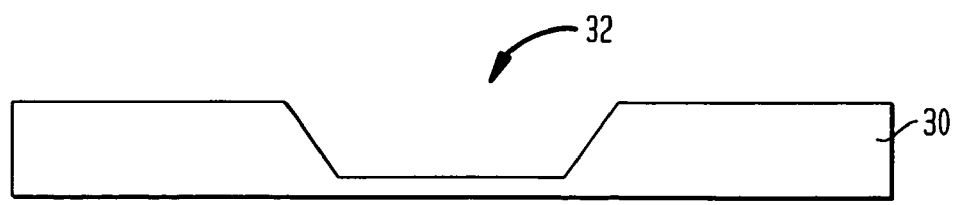

FIG. 1 is a plan view of a chip 8 having a surface acoustic wave (SAW) filter device 10. FIG. 2 is a cross-sectional view of the chip 8 through lines 2-2. The chip 8 has a front surface 9 (FIG. 2) extending between peripheral edges 13 of the chip. As shown in FIG. 1, the SAW device includes a SAW active area 12 which is connected by wiring 11 to a pair of contacts 14 and 16, all of which are located on the front surface. The SAW active area 12, wiring 11 and contacts 14 and 16 are isolated from other elements of chip 8 by isolating material 18. Metal conductive patterns 20 partially surround the SAW active area 12 and wiring 11. In addition to contacts 14 and 16, additional contacts 22 are provided on the chip 8 to allow for interconnection to other optional elements of the chip 8, e.g., passive devices or other active devices.

As shown in FIG. 2, the active area 12 and contacts 14, 16 are all located on the front surface 9 of the chip 8. As further illustrated in FIG. 2, an insulating film 24 is formed over the wiring 11 between a contact 14 and SAW active area 12, and over the wiring 11 between the SAW active area 12 and contact 16. This can be performed as by selective deposition through a contact mask, or alternatively by blanket deposition followed by masking and subsequent etching to expose the SAW active area 12 and contacts 14, 16 of the chip 8.

As also shown in FIGS. 1 and 2, a metal base pattern 26 surrounds the SAW active area 12, insulated from the metal conductive patterns 20 by the insulating film 24. The metal base pattern 26 serves as a base to which a cap will be joined later by the reflowing of a metal such as tin, lead, solder or eutectic composition provided at the interface between the chip 8 and the cap. The metal base pattern 26 is formed of a metal such as aluminum or copper, preferably having a barrier layer formed thereover including a metal such as nickel. A layer of gold, platinum or palladium is preferably formed over the barrier layer as a protective layer for providing improved resistance to oxidation. A layer of tin, lead, solder or eutectic composition is optionally formed over the barrier layer, or the protective layer when present, to provide reflowable material for later joining the base pattern 26 to a cap.

FIGS. 3-7 illustrate steps in a process of pre-forming a cap on a mandrel, to be joined to a chip 8 such as that having a SAW device 10 as illustrated in FIGS. 1-2. As shown in the cross-sectional diagram of FIG. 3, a mandrel 30 is provided from a block of material having a depression 32 formed therein. The depression 32 corresponds to the general shape and size of the cap to be formed thereon. The depression is typically formed by etching the mandrel to a depth of 20 to 30 microns. In order to match the metal base pattern 26 of the chip 8, the depression 32 should have a generally rectangular shape. However, the corners of the depression are preferably rounded to some minimum or greater radius, to help avoid stresses at the junctions between sides of the cap to be formed thereon. The block of material from which the mandrel is provided is preferably rigid or substantially rigid, and includes a material capable of withstanding the cap forming processes described below. For example, the mandrel 30 can be formed of a block of metal such as stainless steel, having an overlying layer of a low adhesion metal (not shown) such as chromium to facilitate lift-off of the cap under an appropriately applied force, after fabricating the cap and joining it to the chip 8.

Figure 4:
Figure 5:
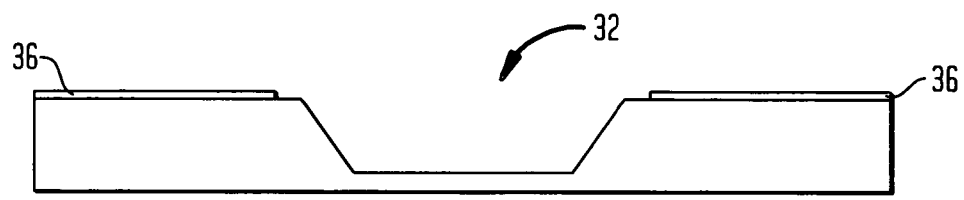

As shown in FIG. 4, an insulating coating 34 is applied to the mandrel 30. The insulating coating is then removed from the depression 32, as by a masked etch, after which areas 36 remain on mandrel 30, as shown in FIG. 5. The insulating coating is preferably formed by depositing diamond material by chemical vapor deposition (CVD). Alternatively, the insulating coating can be formed of any suitable dielectric material such as silicon dioxide, silicon nitride, polyimide or other organic or inorganic dielectric material. For example, the insulating coating can be formed by a timed thermal oxidation, as commonly performed in a passivation process.

Figure 6:
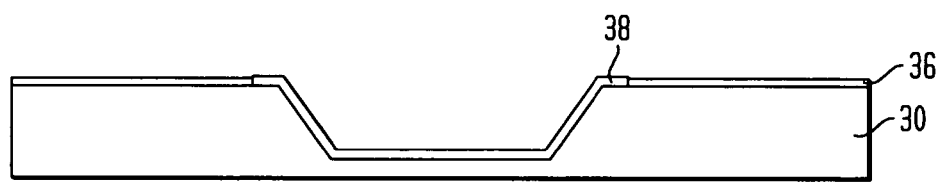

Thereafter, as shown in FIG. 6, a first metal layer 38 is formed on the mandrel 30. In a particular embodiment, the first metal layer 38 is formed by electroplating onto an exposed metallic (e.g., chromium) layer of the mandrel 30, such that the first metal layer 38 is not formed on the insulating areas 36 of the mandrel 30. Copper or aluminum is preferred as a first metal. Further, copper is preferred over aluminum because of better adhesion during the plating process onto the overlying metal layer (e.g., chromium layer) of the mandrel 30.

Figure 7:
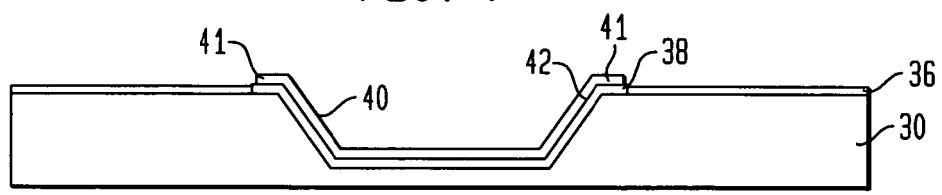

Then, as shown in FIG. 7, a second metal layer 40 is formed over the first metal layer 38, again preferably by electroplating, such that the second metal layer 40 does not form on the insulating areas 36 of the mandrel 30. The second metal layer preferably includes a barrier layer such as nickel. Preferably, a protective metal (not shown) which resists oxidation such as gold, platinum, or palladium is then formed over the barrier metal, and a reflowable metal (also not shown) such as tin, lead, solder or a eutectic composition may be optionally formed, as a layer for contacting and forming a seal to the metal base pattern 26 of the SAW device 10 (FIG. 2) Collectively, these metal layers 38, 40 and optional protective metal layer and reflowable metal form a cap 42.

Alternatively, a first metal layer, including an electrolessly platable metal such as nickel is electrolessly plated onto the surface of the mandrel. Other electrolessly platable metals include cobalt, and alloys of nickel with another metal such as tungsten, cobalt, iron, rhenium or molybdenum, and alloys of cobalt with another metal such as tungsten. Boron or phosphorous is also typically a component of electroless coatings, in controlled percentages. Thereafter, a second metal layer is formed, desirably including tin. For example, tin is electroplated onto the surface of the underlying nickel layer.

Figure 8:
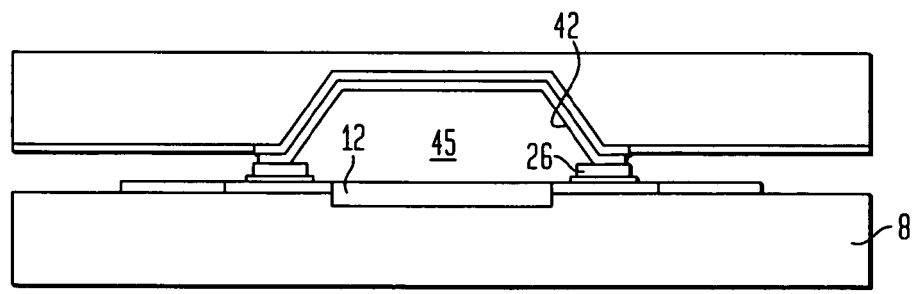

With the cap 42 now formed, the raised edges 41 of the cap 42 which extend above the mandrel 30 are contacted to the metal base pattern 26 of the chip 8, as shown in FIG. 8. Heat and pressure are applied between the cap 42 and the chip 8 seals the cap 42 to the chip, leaving a cavity 45 between the active area 12 of the chip 8 and the cap 42 for the propagation of surface acoustic waves. Alternatively, when the cap 42 is joined to a different kind of chip other than a SAW device 10, such as a MEM (micro-electromechanical) device chip, the cap 42 protects the exposed small and/or moving parts of the MEMs.

The cap 42 is joined to the metal base pattern 26 in such a way to hermetically seal the active area 12 of the chip 8. The joining process is desirably performed by heating the mandrel including a multiplicity of caps 42 thereon and pressing the mandrel cap-side down onto the corresponding metal base patterns of a wafer containing the chips. This process can be performed with solder, or without solder when the caps or metal base patterns include a joining metal or metals such as tin or tin-gold. If the cap 42 is soldered, the soldering process is preferably performed in a vacuum or other substantially oxygen-free ambient to reduce the incidence of included material within the cavity under the cap 42. Soldering can be performed under such conditions without the use of a flux, as flux is only needed to draw away oxidation products, which are not present in a vacuum. Whether the joining process is performed with or without solder, the joining of the caps to chips in a vacuum or substantially oxygen-free environment helps to produce a low-oxygen environment inside the cavity 45 enclosed by the cap.

Figure 9:
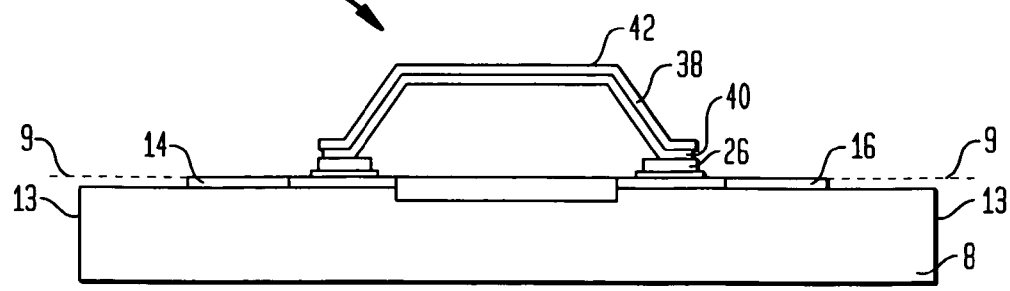

Thereafter, the mandrel is detached from the cap 42, leaving the cap 42 adhering to the metal base pattern 26 of the SAW device 10, as shown in FIG. 9. When the first metal layer 38 includes nickel and the mandrel is a silicon wafer, mismatch of the coefficients of thermal expansion (CTE) between the silicon and nickel materials having CTEs having relative values of 14 and 3, respectively, helps cause the cap 42 to detach from the mandrel as a result of cooling after it is joined to the chip 8. As illustrated in FIG. 9, the cap 42 is now joined to the chip 8 in a way which leaves the front surface 9 of the chip 8 exposed, from the contacts 14, 16 to the edges 13 of the chip 8. Thereafter, the assembly 48 formed by joining the cap 42 to the chip 8 is now available for packaging according to any of several alternative ways.

For example, the assembly can be placed face up on a packaging element and then wire-bonded from the pads of the SAW device chip 8 to the terminals of a packaging element. In another example, the assembly is joined to other packaging elements according to any of the several alternatives disclosed in commonly assigned U.S. patent application Ser. No. 10/786,825 filed on Feb. 25, 2004, U.S. Provisional Application No. 60/449,673 filed Feb. 25, 2003 and U.S. Provisional Application No. 60/456,737 filed on Mar. 21, 2003, the entire applications of which are incorporated herein by reference.

Figure 10A:
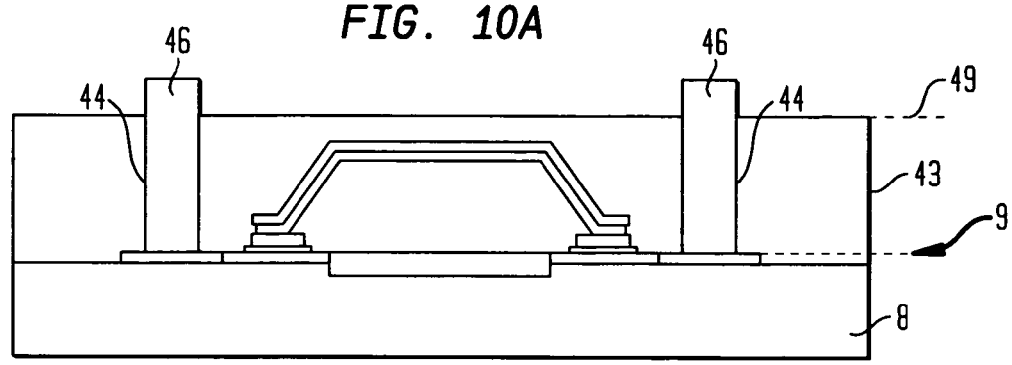

In another example, as shown in FIG. 10A, the assembly 48 can be encapsulated in a polymer, epoxy, or elastomeric material, and then a set of openings 44 are made to the contacts 14, 16 of the chip 8, as by mechanical or laser drilling (ablation), stopping on the underlying metal of the contacts 14 and 16. Alternatively, the openings are molded in place when the encapsulant is applied to the assembly. The openings are then filled with a connection-forming metal such as tin, solder or a eutectic composition to form conductive connectors 46, which can then be joined to a microelectronic element, e.g., a packaging element at an exposed plane 49 above the front surface 9 of the chip 8. As shown in FIG. 10A, the connectors 46 are shown extending above the openings 44, as held in place by surface tension of the metal which is deposited when molten. Alternatively, connectors can be formed by placement of pre-formed metallic features, such as solder balls, within the openings 44 and thereafter heating to join the solder balls to the underlying contacts to form the connectors 46.

Figure 10B:
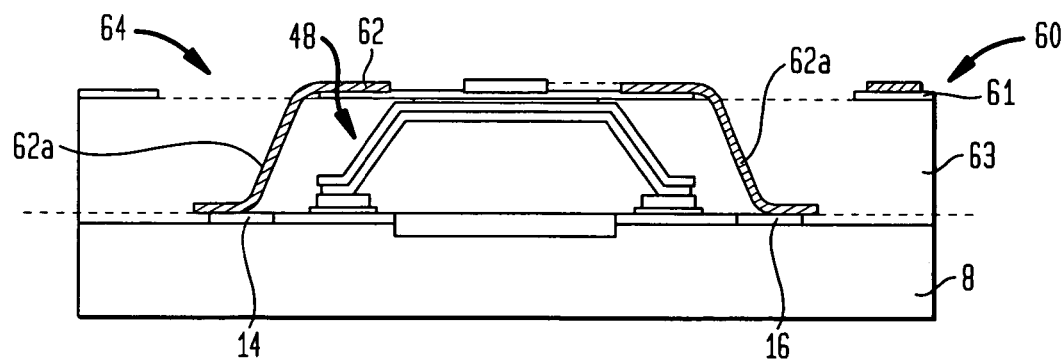
FIG. 10B is a cross-sectional view illustrating an assembly including a capped chip according to a variation of the first embodiment of the invention.

In an arrangement shown in FIG. 10B, the capped chip 48 is mounted to a chip carrier 60 having a dielectric element 61 and metal patterns 62 disposed thereon. For example, the chip carrier 60 can be a tape-like element having a plurality of cantilevered or frangible leads 62a which are bonded to corresponding contacts 14, 16 of the chip by pressure and/or heat from a bonding tool through a bonding window 64 provided in the chip carrier 60. Desirably, an encapsulant 63 is then provided between the capped chip 48 and the chip carrier 60.

Figure 10C:
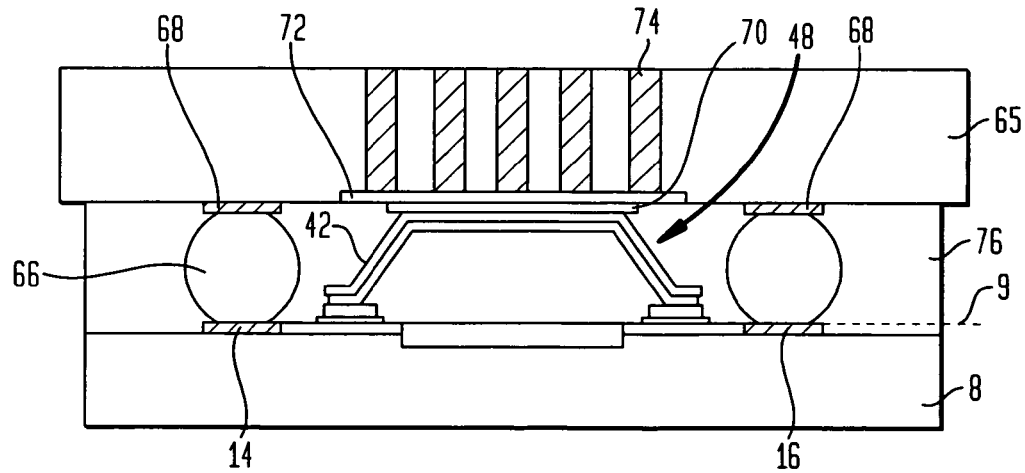
FIG. 10C is a cross-sectional view illustrating an assembly including a capped chip according to another variation of the first embodiment of the invention.

In another arrangement, as shown in FIG. 10C, the capped chip 48 is mounted to a circuit panel 65 by solder balls 66. The solder balls are provided on the contacts 14, 16 of the chip and mounted to corresponding pads 68 of the circuit panel 65. The cap is mounted to the circuit panel 65 by conductive adhesive or solder 70 at an interface to a pad 72 of the circuit panel. The pad 72 is desirably a thermally conductive element which carries heat away from the capped chip 48, such as by way of conductive vias 74 provided in the circuit panel 65. Desirably, an encapsulant 76 is then provided between the capped chip 48 and the circuit panel 65. Still other arrangements for assembling the capped chip to a circuit panel, chip carrier, lead frame and other elements are described in the aforementioned U.S. patent application Ser. No. 10/786,825 and U.S. Provisional Application Nos. 60/449,673 and 60/456,737.

Consideration must be given to the need to simultaneously align the multiplicity of chips, having a particular coefficient of thermal expansion (CTE) corresponding to the semiconductor material of the chip, to the multiplicity of caps formed on a mandrel, which, in many cases, has a different CTE. Particularly as to wafers of 200 mm and 300 mm sizes, as common today, a factor of five difference between the CTEs of silicon chips and a metal mandrel is enough to produce a relative change in position of 36 μm over a 300 mm wafer when the temperature varies by 10 degrees C. If the temperature varies by 50 degrees C. this relative change in position can reach 200 μm or more. This is significant because chip pads typically have dimensions of less than 100 μm in each direction of the front surface 9 of the chip 8. Therefore, thermal expansion poses a risk that the caps 42 will not be aligned with the chips 8.

A possible solution to this problem is to fabricate the multiplicity of caps on a mandrel formed of the same semiconductor material as that of the chips, such that the mandrel, to which the caps adhere prior to joining them to the chips, expands and contracts the same in relation to the chips. Molybdenum and glass are other examples of materials having the same or similar CTEs as chips. Proper alignment can be achieved through such techniques.

In another alternative solution, the mandrel on which the caps are fabricated can be formed of a material having a different CTE than the CTE of the chips. In such case, the mandrel should be sized in a way such that the array of the caps become aligned with the array of chips when the joining temperature is reached, and joining then proceeds under such conditions. For example, when the mandrel is formed of stainless steel, its CTE is about 15 ppm/deg. C., which is about five times larger than the CTE of silicon, being about 3.0 ppm/deg. C., the material of the chip on which an exemplary SAW device 10 is provided. The mandrel should be formed of a material having a predictable and isotropic CTE such as metals and glass. Since the mandrel is formed of a material having a higher CTE, then at room temperature, the array-wise arrangement of the caps 42 on mandrel 30 (FIG. 7) should be somewhat smaller than the array-wise arrangement of chips. This will allow the mandrel to expand to a degree at which the caps become aligned to the chips at the joining temperature. After joining, the mandrel is detached from the caps at or only somewhat below the joining temperature. In such manner, the caps remain aligned to the chips when the mandrel is detached.

Figure 11A:
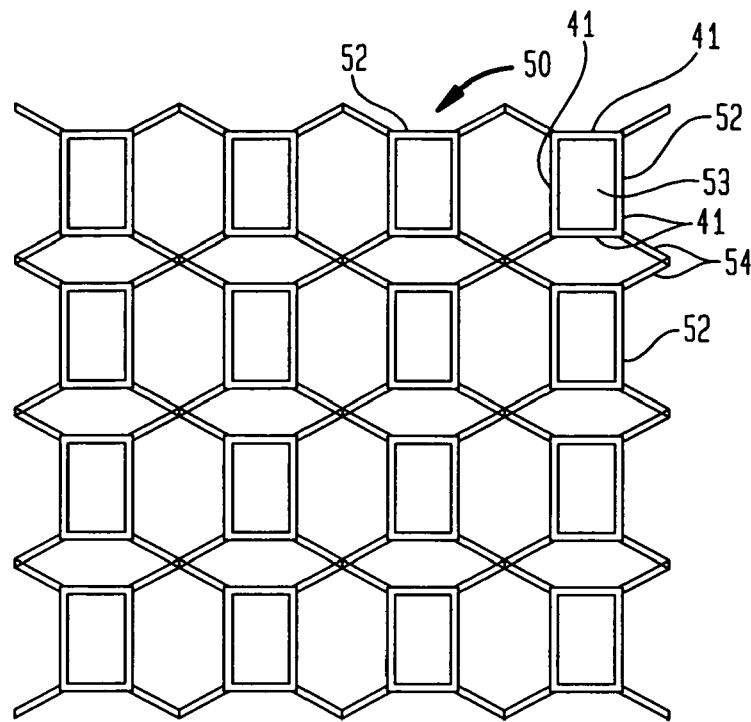
FIGS. 11A-11D are views illustrating stages in yet another variation of the first embodiment of the invention.

A variation of the above embodiment of the invention will now be described, with reference to FIGS. 11A-11D. According to this variation, as shown in FIG. 11A, caps 52 are formed integrally to a cap frame 50 by processing a metal sheet, as will be described more fully below. Then, the caps 52 are simultaneously joined to an array of chips of a wafer or subportion thereof as described above. The caps can then be severed from the cap frame at the same time that chips are severed from each other. Alternatively, as according to the needs of the particular process, caps 52 can be first separated from the cap frame 50 and then joined to respective chips on an individual basis.

In FIG. 11A, the bottom (chip-facing) side of a cap frame 50 is shown, including a multiplicity of caps 52 arranged in an array. The caps 52 are held together in the cap frame 50 by connecting members 54 extending between respective caps 52. On the bottom, chip-facing side of each cap 52 is a cavity 53 surrounded by raised edges 41. The cap frame 50 is formed of a base metal, for example, copper or aluminum, over which a layer of a barrier metal such as nickel is desirably formed. For example, the cap frame 50 can be formed by stamping a sheet of the base metal, and then electroplating the barrier metal onto the stamped sheet. The cap frame 50 may also be provided with a joining metal such as tin, lead, solder or eutectic composition, to facilitate adhesion to the metal base pattern on the chip, as described above.

Figure 11B:
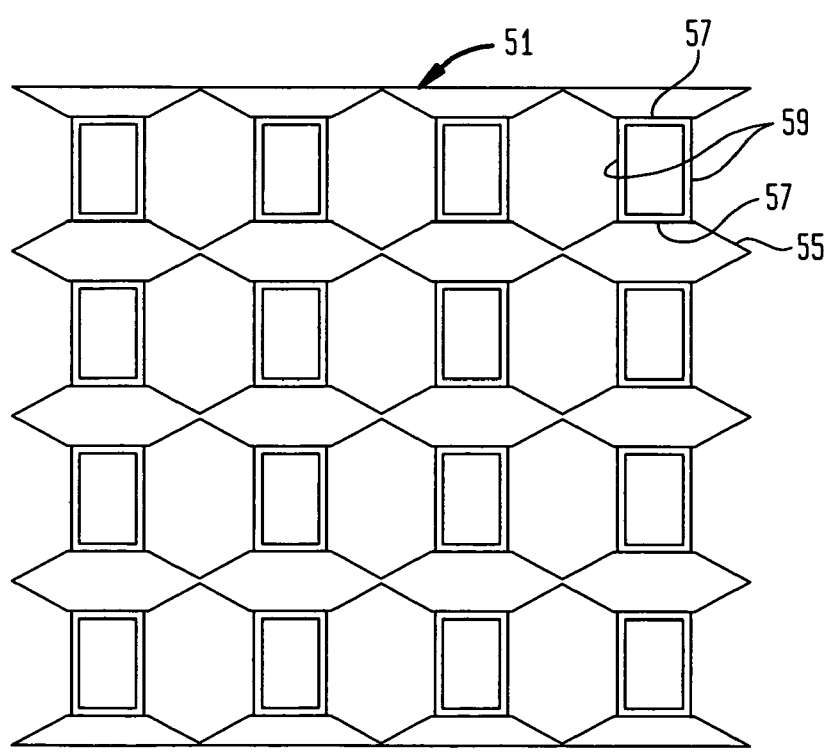

An alternative embodiment of a cap frame 51 is illustrated in FIG. 11B. The cap frame 51 of this embodiment differs from the above-described embodiment in that the members 55 on some sides 57 of each cap have substantial area and fill the space between opposing sides of caps. Other sides 59 of each cap are left open to permit access to contacts on the chip by electrical connecting elements.

Figure 11C:
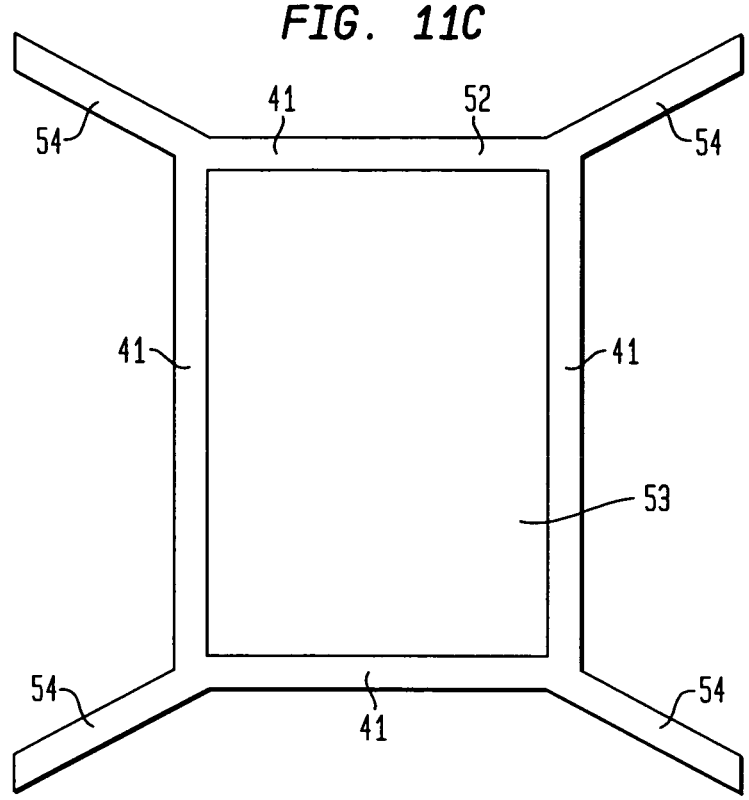
Figure 11D:
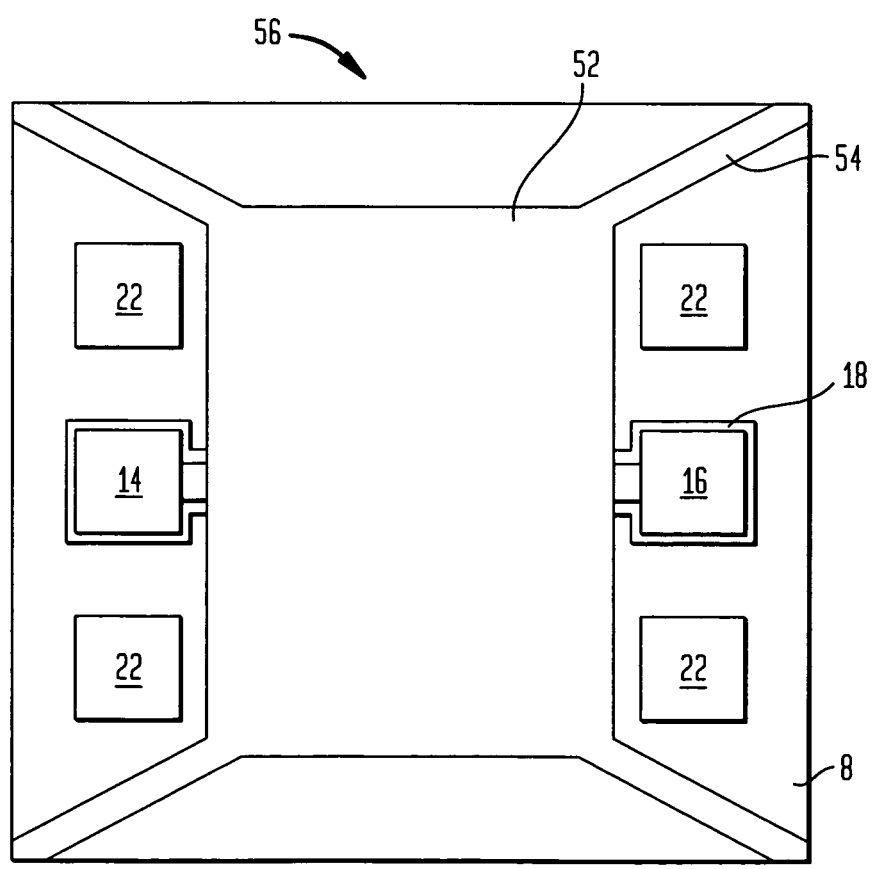

An individual cap 52 of cap frame 50 (FIG. 11A) is illustrated in FIG. 11C, showing connecting members, raised edges 41 and cavity 53. The capped chip 56, shown in FIG. 11D, is formed by joining the cap frame 50 to an array of chips 8 according to processes described above relative to FIG. 9 except that there is no mandrel. The cap frame 50 as joined to chips 8 is then severed into individual chips by severing the cap frame simultaneously with the chips. A cross-sectional view through lines 2-2 of the capped chip 56 shown in FIG. 11D is substantially as shown and described above relative to FIG. 9. Optionally, the capped chip can be further processed into an assembly, as discussed above with reference to FIGS. 10A through 10C.

Figure 12:
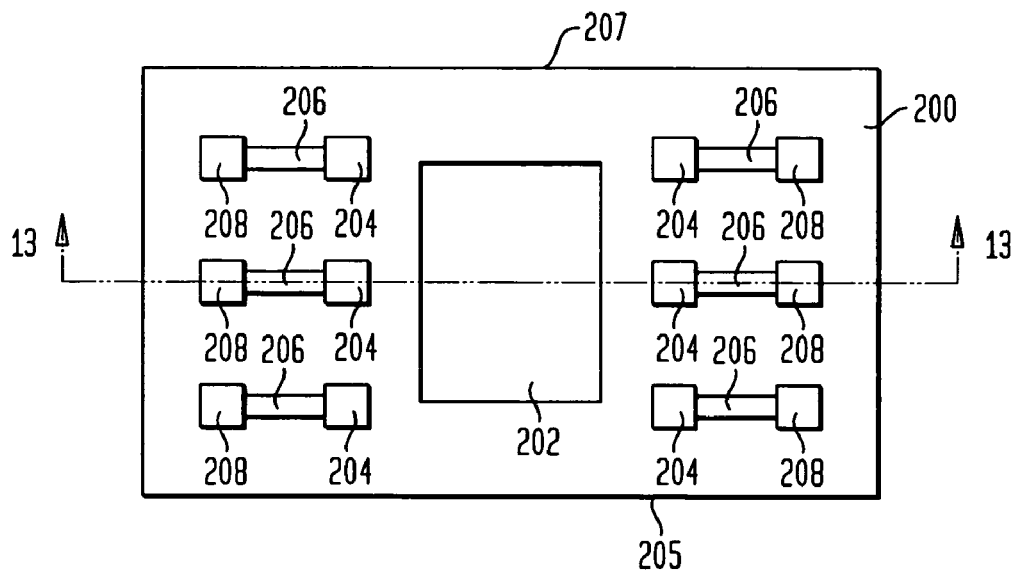
FIG. 12 is a plan view illustrating a microelectronic substrate on which a cap according to second embodiment of the invention is formed.

Another embodiment is now described with reference to FIGS. 12-16, in which caps are fabricated from microelectronic substrates, e.g., semiconductor substrates. In this embodiment, as illustrated in FIG. 12, a cap is formed by a depression 202 in a semiconductor substrate 200 such as one adapted to include one or more passive devices such as resistors, inductors or capacitors, as commonly referred to as "integrated passives on chip" (IPOC). The semiconductor substrate may even include one or more active devices (as, for example, transistors and logic gates) therein.

Figure 13:
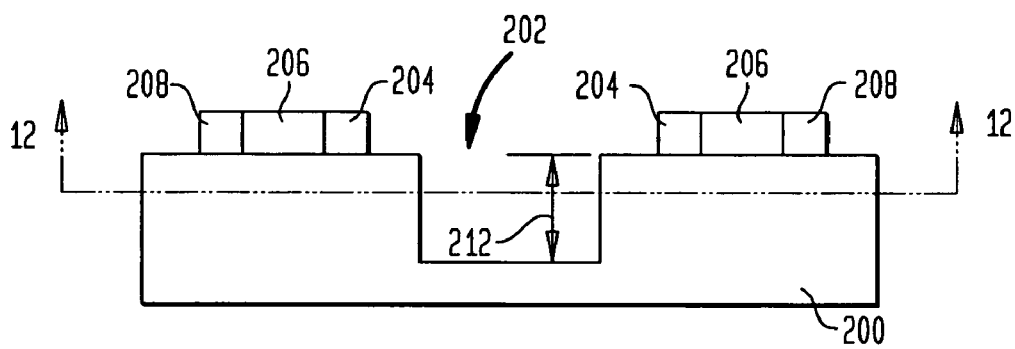
FIGS. 13-16 are views illustrating stages in a fabrication process according to a second embodiment of the invention.

A microelectronic substrate 200, e.g., a semiconductor substrate, having a depression 202 is shown in plan view in FIG. 12 and a cross-section thereof through lines 13-13 in FIG. 13. The microelectronic substrate 200 includes a plurality of first terminals 204 for providing electrical interconnection to a chip. The first terminals 204 are conductively coupled to conductors 206, which in turn, are conductively coupled, directly or indirectly, i.e., through one or more devices (e.g., passive devices) on microelectronic substrate 200, to a second set of terminals 208. The microelectronic substrate 200 is preferably fabricated as one of many units of a wafer using conventional wafer fabrication processes, and then later diced to form a singulated die. In the description to follow, processing of the microelectronic substrate 200 is desirably performed while units thereof remain attached to each other, at least at a south edge 205, a north edge 207, or both, and only singulated after units have been fully processed and joined to chips.

Figure 14:
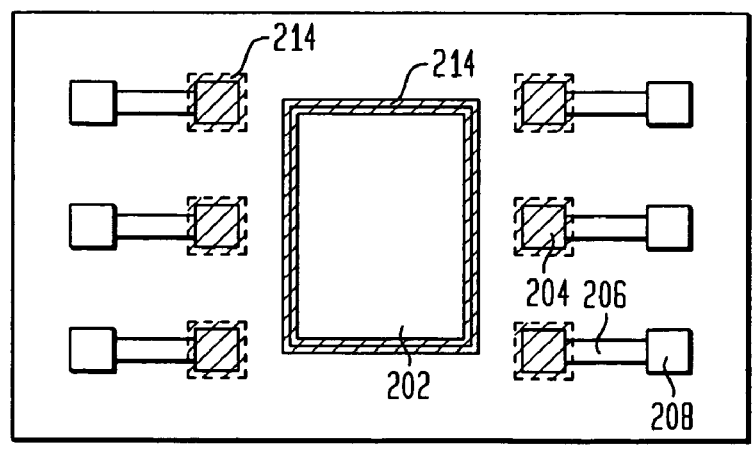
Figure 15:
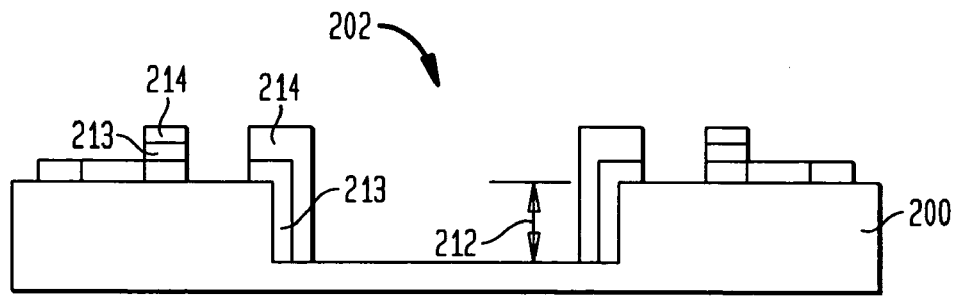

FIGS. 14 and 15 illustrate the preparation of the microelectronic substrate 200 prior to joining to the chip. A first metal layer 213 (FIG. 15) is provided at least on edges of the depression 202 by depositing a metal such as copper or aluminum, followed by a barrier metal such as nickel. Thereafter, a joining metal layer 214 such as tin, solder, lead or eutectic composition is formed over the metallized areas, to facilitate later joining the substrate 200 to a chip. These metal layers 213 and 214 are also formed on terminals 204 of substrate 200 for facilitating electrical interconnection with the chip. The metal layers 213 and 214, which are provided at least on all the edges of depression 202, are used to form a seal later between the microelectronic substrate 200 and the chip.

In this step, since the depression 202 in the microelectronic substrate 200 already provides a well-defined, rigid or semi-rigid internal cavity, the metallized areas need not extend much in either direction beyond the edges of the depression 202 and the first terminals 204, and can be formed by contact lithography, for example. When the metallized areas are provided only in the vicinity of the edges 210, this permits the depth 212 of the depression 202 to be less than that required than if the entire interior surface of the depression 202 were to be metallized. Alternatively, the metallized areas need not be confined to only the edges of the depression 202, as other needs, such as shielding from electromagnetic interference, may favor metallizing the entire depression 202.

Figure 16:
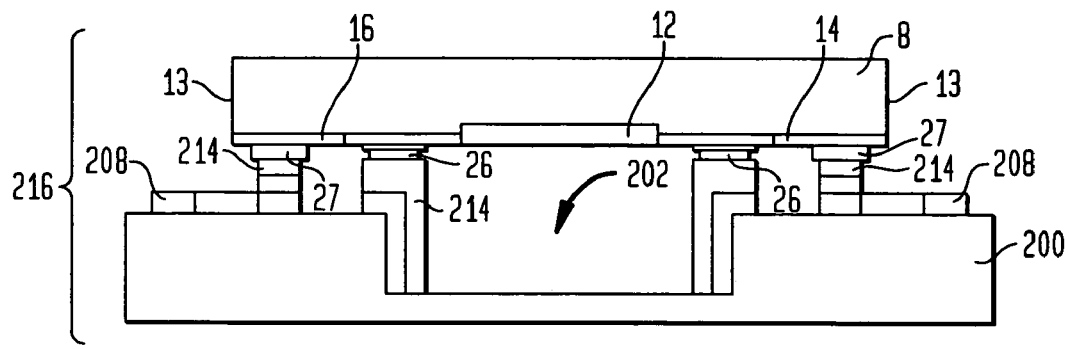

Next, as shown in FIG. 16, a chip 8 is joined to the microelectronic substrate 200 to form a capped chip 216 such that the active area 12 of the chip 8 faces the depression 202. The microelectronic substrate 200 is joined to the chip 8 in such manner that a front (terminal-bearing) surface of the microelectronic substrate 200 faces the front surface 9 of the chip 8. The microelectronic substrate 200 also extends beyond peripheral edges 13 of the chip, such that the terminals 208 are not covered by the chip 8.

As discussed above and as depicted in FIGS. 1 and 2, the chip 8 has a metal base pattern 26 and contacts 14 and 16. As shown at 27, contacts 14 and 16 are desirably metallized, prior to joining the microelectronic substrate to the chip 8, with a barrier metal such as nickel, followed by a protective metal (e.g., gold, platinum or palladium), to facilitate mating of the chip to the microelectronic substrate 200. The joining step is performed by soldering, or by reflowing of the joining metal 214 to corresponding metal patterns of the chip 8 including the metal base pattern 26 and contacts 14, 16 of the chip 8. In this embodiment, as well, the joining step desirably is performed in either an evacuated chamber or under conditions in which little or no oxygen is present in the ambient.

Because the chip 8 and the microelectronic substrate 200 are both desirably made of a semiconductor material, which can be the same semiconductor material, a joined assembly 216 can be provided having the same coefficient of thermal expansion (CTE) for both chip 8 and microelectronic substrate 200. This facilitates alignment, despite expansion or contraction of the elements due to temperature fluctuations, particularly where the joining step is performed while the substrate 200 is part of a larger wafer or unit. Moreover, the matched CTEs of the cap 200 and chip 8 help to limit stresses imposed on the bonds at the seal during service.

Thereafter, the capped chip 216 is joined by further processing to another element of an electronic assembly (not shown) by any of several techniques for interconnecting the terminals 208 to another element. For example, terminals 208 can be wire-bonded to elements of a lower circuit panel (not shown) or lead frame (not shown). Alternatively, the second set of terminals 208 of the joined assembly 216 can be directly connected to frangible leads of a lead frame (not shown) of a package, as described in the aforementioned U.S. patent application Ser. No. 10/786,825 and U.S. Provisional Application Nos. 60/449,673 and 60/456,737. Thereafter, the capped chip 216 can be encapsulated together with the other element in an encapsulant, desirably being elastomeric, for protecting the connections between external terminals 208 and the other element (not shown), despite changes in temperature that may cause the capped chip 216 and the other element to move relative to each other.

Figure 17:
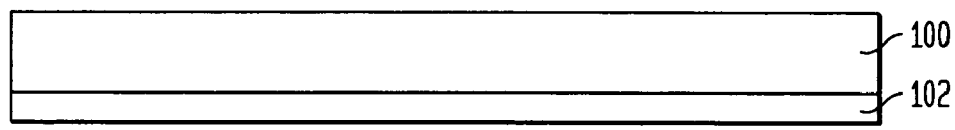

A third embodiment is illustrated with reference to FIGS. 17-25. As shown in FIG. 17, a dielectric panel 100 is provided with a metal layer 102 thereon. The dielectric panel 100 is desirably provided as a flexible membrane extending tape-like or web-like in one or more horizontal directions. Alternatively, the dielectric panel 100 can be a rigid or semi-rigid member including elements commonly used in the fabrication of circuit boards, e.g., a polymer, epoxy, fiberglass mesh, BT resin, polyimide and the like.

Figure 18:
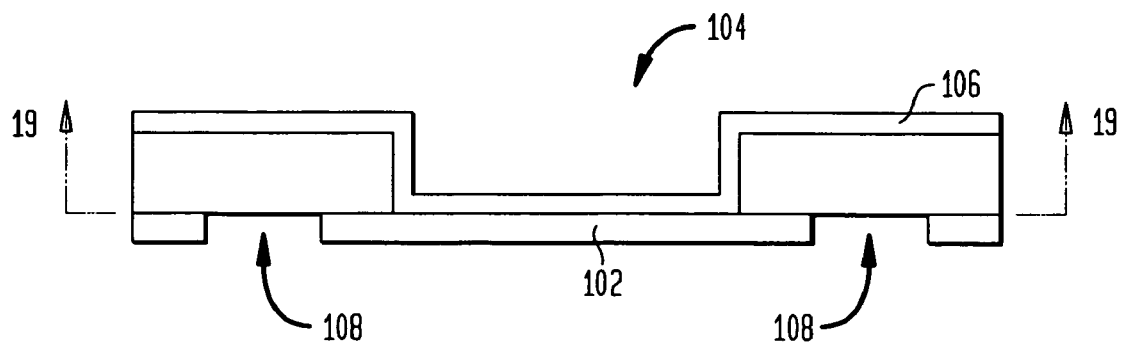
Figure 19:
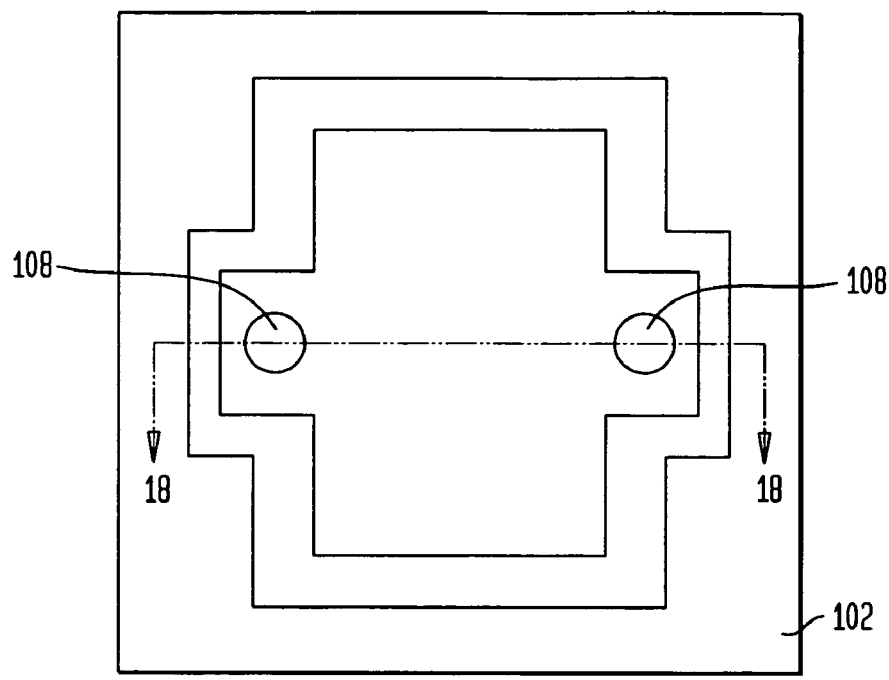
Figure 20:
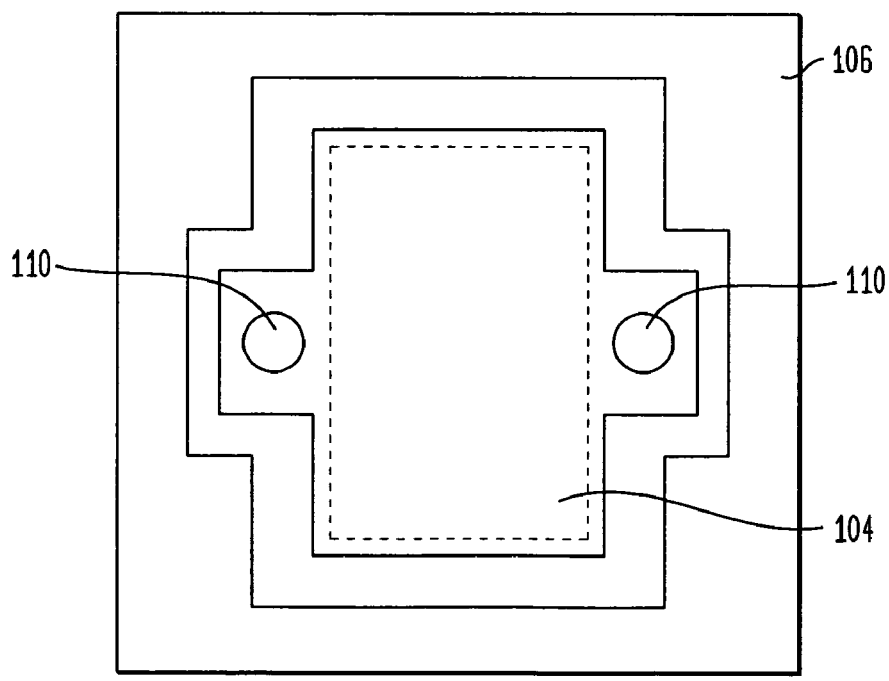

The metal layer 102 provides an etch stop and a means of holding portions of the dielectric panel 100 together during subsequent processing. As shown in FIGS. 18 and 19, openings 108 are formed in the first metal layer 102 corresponding to locations where openings in the dielectric panel 100 will be subsequently formed. As shown in FIGS. 18 and 20, a depression 104 is formed in the dielectric panel 100, e.g., as by a masked etch, and then a layer of metal is deposited thereover as a cap metal layer 106. The cap metal layer 106 is formed by a series of metal depositions such as those described above with respect to FIGS. 6 and 7. The openings 108 can be made by a photolithographic masked etch, for example. The openings 108 can be formed either before or after the step in which second metal layer 106 is deposited to cover depression 104.

Figure 21:

As shown in FIGS. 20-21, openings 110 are formed in the second metal layer 106 which correspond to the locations of openings 108 in the first metal layer. Again, such openings can be made by a photolithographic masked etch, for example. Alternatively, openings 110 can be formed at the same time the second metal layer is formed, i.e., by selective deposition of the metal to cover dielectric panel 100 in all areas other than the openings 110. For example, blocking features can be first formed which correspond to the locations of the openings, and the metal then deposited, such that the blocking features prevent the metal from being deposited in the openings. The blocking features are then subsequently removed.

Figure 22:
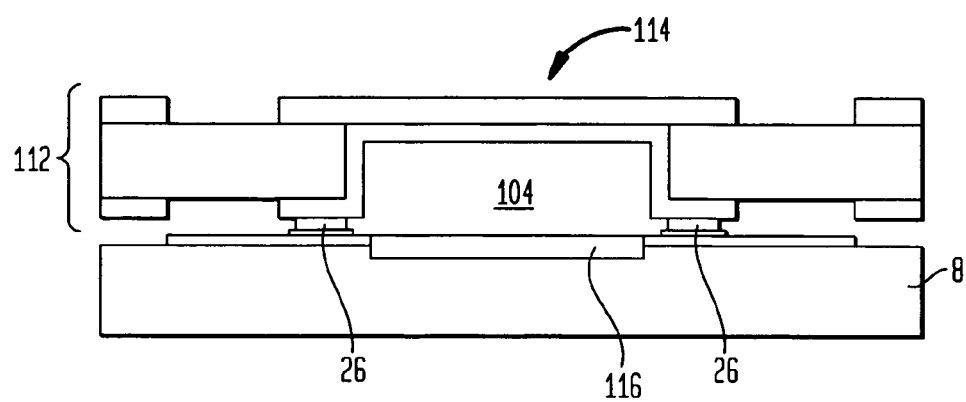

As shown in FIG. 22, the cap structure 112 is now joined to the chip 8, thereby forming a capped chip 114 having a cavity over an area of the chip 8. Desirably, an adhesive (not shown) is provided for joining the cap structure 112 to the chip 8, since an adhesive can be applied and set generally at room temperature or within the range of temperatures at which the chip is expected to operate, such that the joining of the chip 8 to the cap structure 112 does not require a temperature sufficient to melt or reflow metal. If an adhesive is used, it should be applied only to areas that are outside of the depression 104 when applied to the cap structure 112. Otherwise, when applied to the chip 8, the adhesive should be applied to the metal base pattern 26, and not to the active area 116 or the contacts of the chip.

Alternatively, the cap structure 112 may be joined to the chip 8 by means of a reflowable metal such as tin, lead, solder or eutectic composition, which is provided to connection points, i.e., to metal base pattern 26 formed prior thereto on the chip 8, by providing such ref lowable metal on parts of the cap structure 112 that lie outside of the depression 104, prior to joining the chip 8 to the cap structure 112.

Figure 23:
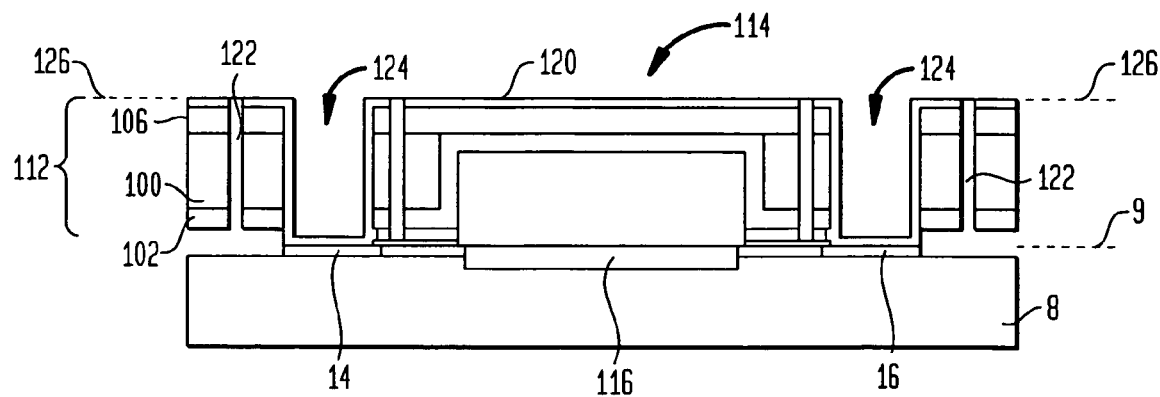
Figure 24:
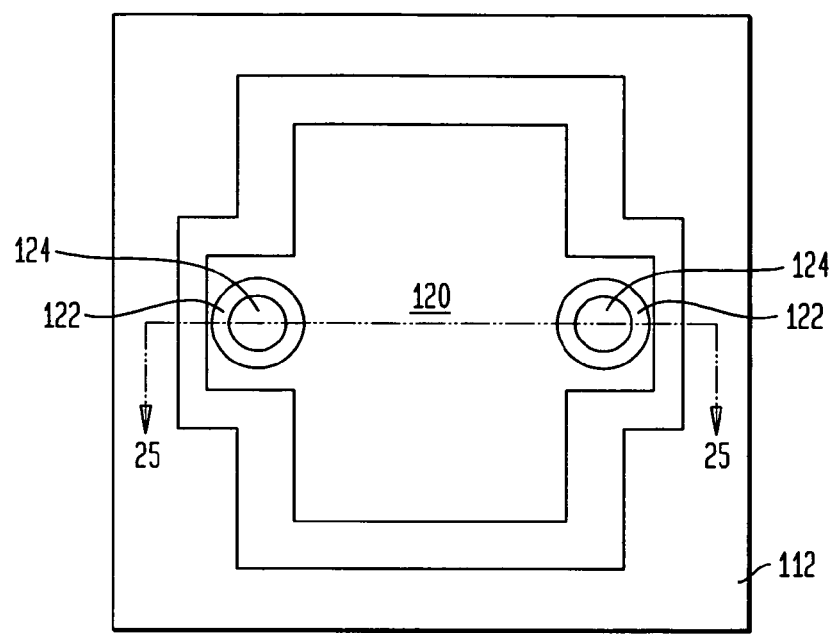

Next, as illustrated in FIGS. 23 and 24, steps are performed to provide a conductive interconnection to contacts 14 and 16 at an exposed plane 126 above the front surface 9 of the chip 8. First, any material of the dielectric panel 100 which remains between the original openings 108 and 110 (FIG. 21) in the first metal layer 102 and second metal layer 106 is removed to form openings 124, as by ablation using a $CO_2$ laser, for example. Alternatively, the openings 124 in the dielectric panel 100 can be formed by etching using an etchant which attacks the dielectric in layer 100, but which does not substantially attack the material of the first and second metal layers and the underlying contacts 14 and 16 of the chip 8. In another example, laser drilling can be performed, stopping on the contacts 14, 16. As another alternative, openings in the dielectric panel 100 can be made at a time prior to joining the cap structure 112 to the chip 8, by any of the above-described techniques.

Thereafter, a third layer of metal 120 is formed covering the capped chip 114. In addition, the third metal layer 120 forms a conductive layer adhering to contacts 14 and 16 with which the chip 8 may be subsequently interconnected to external devices.

The third layer of metal 120 is desirably formed by sputtering. The third layer of 120 is also desirably formed by sequentially sputtering a series of metals such as those used to form the cap structure 112. For example, if the second metal layer 106 of the cap structure includes copper, the third metal layer 120 desirably includes copper. A layer of nickel may then be sputtered over the copper as a compatible barrier metal layer for providing a surface for subsequent adhesion thereto. Thereafter, a reflowable joining metal such as tin, lead, solder or eutectic composition is preferably deposited. Other than by sputtering, the third metal layer 120 can be deposited by any of several well-known techniques such as chemical vapor deposition (CVD), seeding and electroless plating, electroplating, and the like. Thereafter, as shown in the plan view of FIG. 24, the third metal layer 120 is patterned, as by contact lithography, and etched, as by anisotropic vertical etching (e.g., reactive ion etching). These steps result in the creation of isolating grooves 122 in the cap structure 112 surrounding the locations of the contacts of the chip. As a result of such etching, first, second and third metal layers are removed to electrically isolate the contacts from the rest of the third metal layer 120.

Figure 25A:
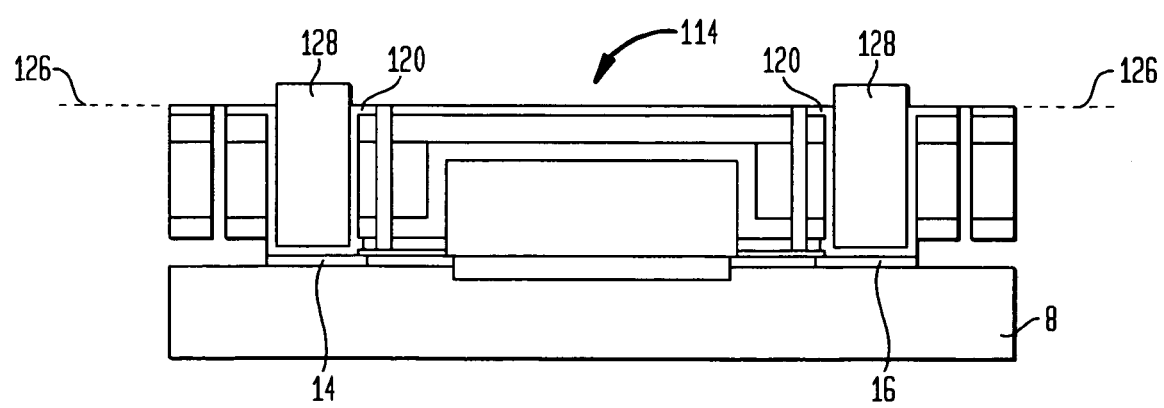

Thereafter, as illustrated in FIG. 25A, connectors 128 including a joining metal such as tin, lead, solder or eutectic composition are applied to contact the third metal layer 120 in the areas inside the isolation patterns where the third metal layer 120 is joined to contacts 14, 16. The connectors 128 desirably extend above the exposed plane 126 defined by the uppermost surface of third metal layer 120. The connectors 128 enable the capped chip 114 to be mounted to another assembly such as a circuit panel, e.g., flexible circuit, printed wiring board, etc., multi-chip carrier, or other assembly. The joining metal connectors 128 can be applied by any of several commonly used methods such as conductive paste screening or solder screening, or screening of pre-formed solder balls into the openings, followed by heating to join the solder balls to the underlying contacts 14, 16.

Thereafter, the capped chip 114 can be mounted by way of another assembly, such as by any of several known techniques, e.g., flip chip attach, wire bonding, mating with a lead frame, or the like such as described in the aforementioned U.S. Provisional Application Nos. 60/449,673 and 60/456,737.

Figure 25B:
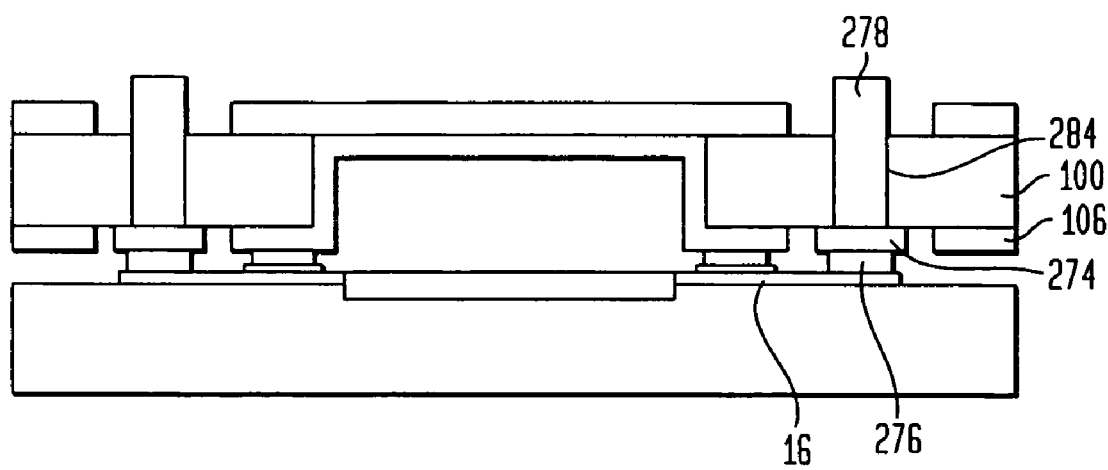
FIGS. 25B and 25C are cross-sectional views illustrating capped chips according to variations of the third embodiment of the invention.

FIG. 25B illustrates a variation of the embodiment shown and described above with reference to FIG. 25A. As shown in FIG. 25B, the cap includes inner terminals 274 patterned in the second metal layer 106. In an embodiment of the invention, the terminals 274 are patterned at the same time that the second metal layer 106 is patterned. The capped chip further includes a joining metal 276 for joining the contacts, e.g., contact 16, of the chip, to the terminals 274 of the cap. Connectors 278 are provided in openings 284 of the dielectric panel 100 according to such methods as described above.

Figure 25C:
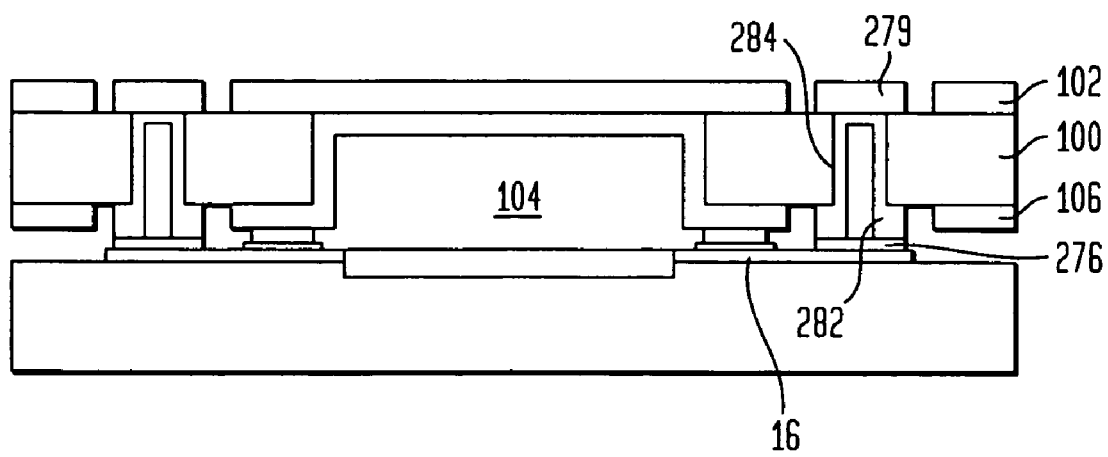

Similarly, FIG. 25C illustrates a variation of the embodiment described above relative to FIG. 25B, in which the cap includes outer terminals 279 patterned in the first metal layer 102 and inner terminals 282 patterned in the second metal layer 106. In a process of making the structure according to an embodiment of the invention, the inner terminals 282 are formed by patterning openings 284 in the dielectric panel 100 simultaneously when forming the depression 104. This step is preferably performed after forming the first metal layer 102, as described above with reference to FIG. 18. Thereafter, the second metal layer 106 is deposited and patterned to simultaneously form the cap and inner terminals 282. In another variation of this embodiment, the openings 284 are patterned after deposition of the second metal layer 106 to extend through the second metal layer and dielectric panel 100, leaving the outer terminals 279 in place. Thereafter, a joining metal is provided in the openings 284, after which the cap is joined to the chip while the joining metal simultaneously connects the contact 16 of the chip to the outer terminal 279.

Figure 26:
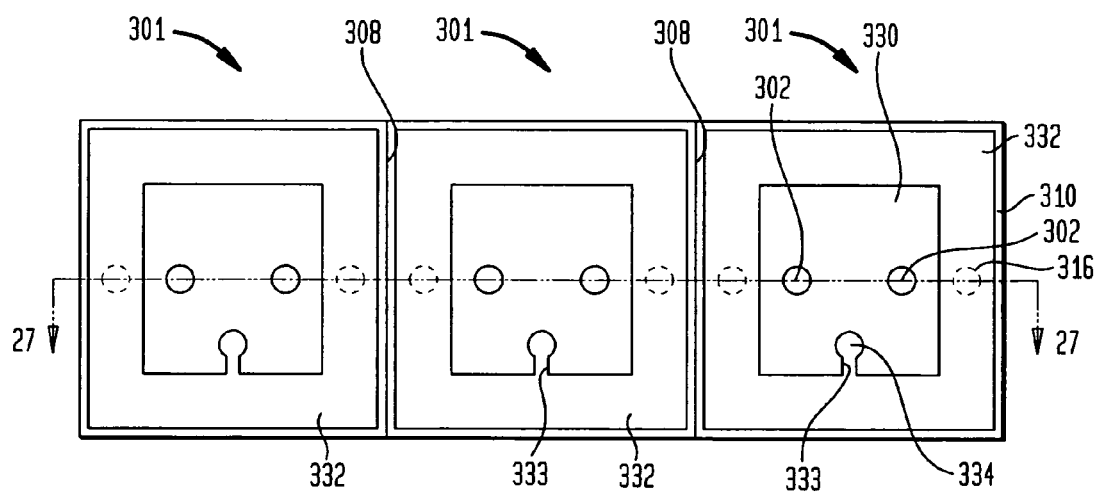
FIGS. 26-30 are views illustrating stages in a fabrication process according to a fourth embodiment of the invention.

In a further embodiment of the invention, a cap substrate 300 (FIGS. 26-27) is formed from an air-impermeable dielectric material such as a ceramic or glass having a front surface 310 and an oppositely-directed rear surface 320. The substrate includes a plurality of cap regions 301, each having a set of metallic features to be associated with one chip as discussed below. The metallic features of each cap region include an annular cap metal pattern 332 on the front surface 310 of the substrate, as well as ground metal terminals 322 on the rear surface 320 of the substrate and conductive ground vias 316 connecting the cap metal patterns with the ground metal terminals for connecting the cap metal pattern 332 to ground. The metallic features of each cap region 301 further include active bonding contacts 302 on the front surface, active terminals 304 on the rear surface and active vias 306 connecting the active bonding contacts with the active terminals. Although only two active bonding contacts 302 are depicted in each cap region in FIG. 26, any number of active bonding contacts may be used. As seen in FIG. 26, the active bonding contacts 302 of each cap region are disposed inside of the annular cap metal pattern 332 of such region. The metallic features of each cap region may optionally include a ground contact 334 disposed inside of the cap metal pattern on the front surface and connected to the cap metal pattern extending along the front surface by trace 333.

Figure 27:
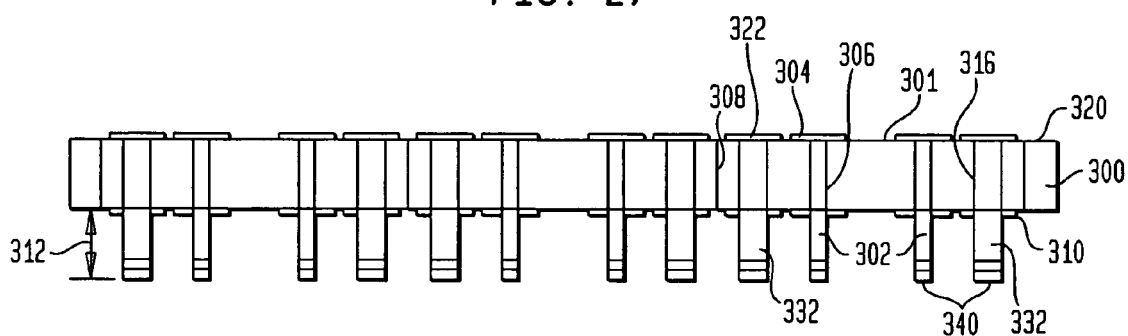

As best seen in FIG. 27, the cap metal patterns 332 and active bonding contacts 302 project from the front surface 310 by a projection distance 312 corresponding to the depth of the cap, most commonly about 20 to about 30 microns. The ground contacts 334 (FIG. 26), which are not visible in the view provided in FIG. 27, also project from the front surface 310 by the projection distance 312. The metallic features may be formed using conventional techniques used in making ceramic or glass circuitized substrates, such as masking and selective deposition of a thin flash metal, typically by sputtering or electroless plating, followed by electroplating. In another process, a nonselective flash metal deposition is followed by masking and back-etching to remove the flash layer in areas covered by the mask and then followed by electroplating. Alternatively, the projecting features may be formed by initially forming the substrate with planar features having minimal or no projection and then masking the rear surface 320 and selectively depositing metal on the metallic features on front surface 310. In a further alternative, the projecting metallic features on the front surface may be formed by providing a relatively thick metallic layer on the front surface, as by laminating the metal layer to the substrate, followed by selective etching to leave only the projecting features.

The tips or extremities 340 of the projecting features bear bonding metals as, for example, a solder or eutectic bonding composition as discussed above.

Figure 28:
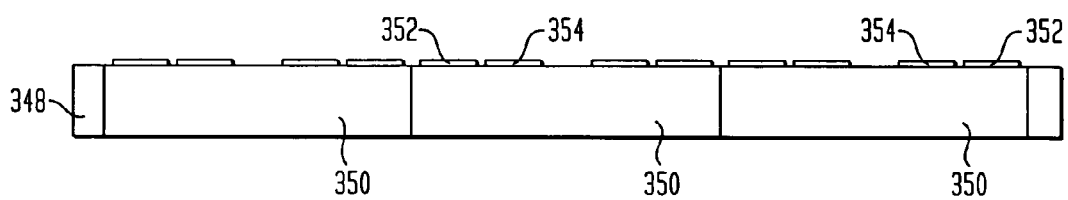

FIG. 28 is a cross-sectional view illustrating a wafer 348 containing a plurality of chips 350 each to be joined to a respective cap region 301 of the cap substrate 300. Each chip 350 includes ground contacts 352 for bonding to the raised cap metal patterns 332 of a cap substrate 300 and active contacts 354 for bonding to the active bonding contacts 302.

Figure 29:
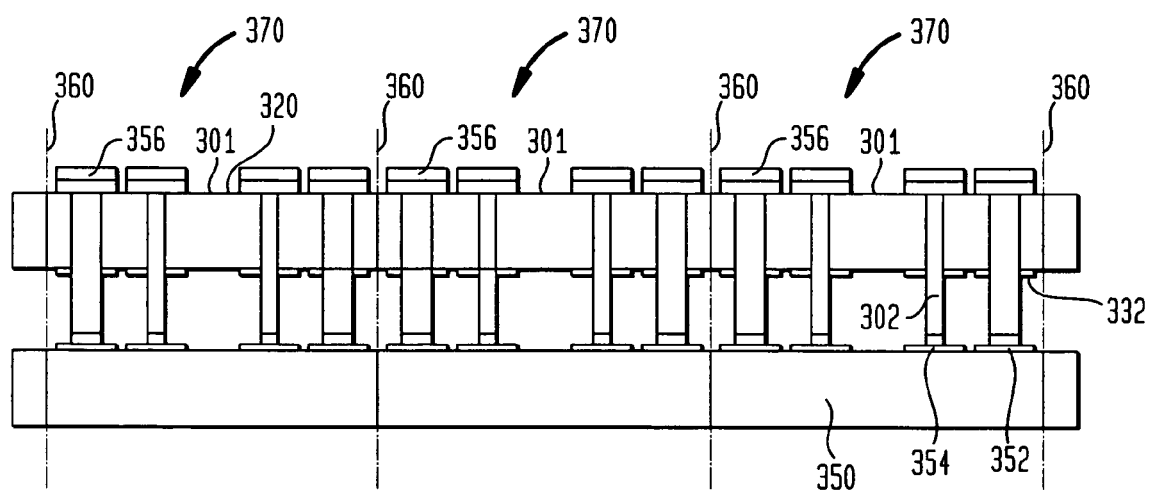

FIG. 29 illustrates an assembly of capped chips 370 each including a chip 350, as joined to a cap 301 of the cap wafer 300. Preferably, the cap metal patterns 332 and active bonding contacts 302 on the cap regions 301 are simultaneously joined to corresponding ground contacts 352 and active contacts 354 on the front surfaces of the chips 350 by application of heat and pressure. Desirably, the joining process is performed as a fluxless process in a vacuum or substantially oxygen-free ambient to avoid oxidation products and/or to provide a low-oxygen environment within the cavity enclosed by the cap 301, as described above with reference to FIG. 8. In a particular embodiment, a solderless joining process is utilized to achieve a higher melting temperature point bond between the caps 301 and the chips 350 than in a soldered bond.

Thereafter, joining features such as solder bumps or solder balls 356 are applied to the metal patterns on the rear surface 320 of the cap substrate 300. This is performed, for example, by applying a patterned solder mask (not shown) to the rear surface of the cap substrate and then depositing solder balls in the openings of the solder mask, followed by removing the solder mask. After bonding the cap substrate to the chips of the wafer and applying solder balls to the rear surface of the caps, the bonded chips and caps are severed along lines 360 to provide individual capped chips.

Desirably, the cap substrate is formed of a material such as molybdenum, a semiconductor material, and glass materials having a CTE close to or matching that of the wafer. Desirably, the size and shape of each cap 301 are the same as that of each chip 350. The resulting capped chip 370 has the same area as the chip 350, making a desirably compact unit for assembly to a larger module, including a chip carrier or circuit panel such as described above with reference to FIGS. 10B and 10C.

In a variation of that shown in FIGS. 26-29, the cap metal patterns 332 extend across the edges 308 of the cap regions, such that they are separated between respective capped chips 370 when the capped chips 370 are severed from one another.

Figure 30:
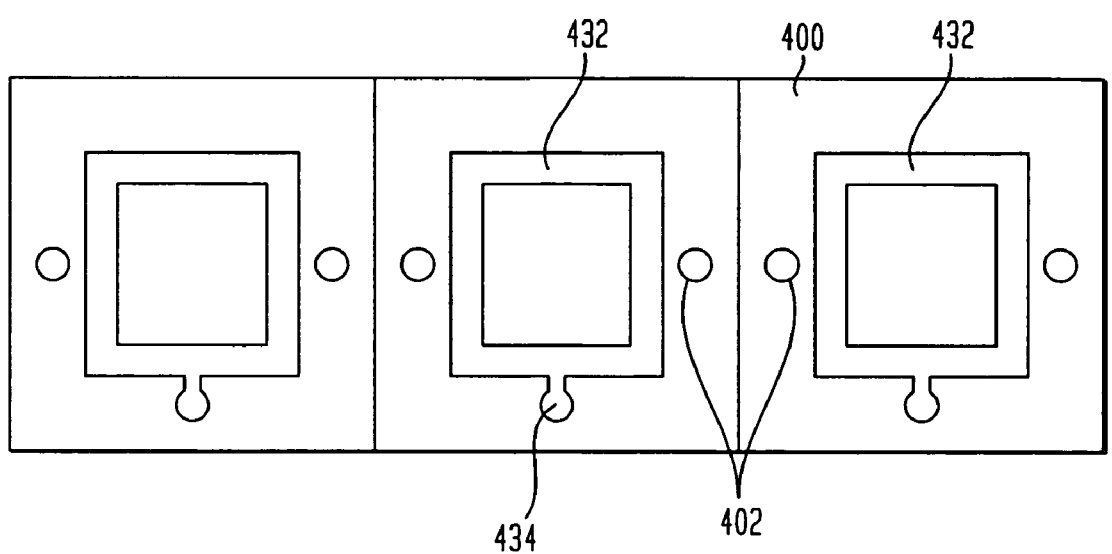

FIG. 30 illustrates an alternative arrangement in which a cap substrate 400 has a plurality of cap metal patterns 432, a plurality of active bonding contacts 402 and a plurality of ground contacts 434 exposed at a top surface of the substrate 400. This arrangement differs from the arrangement described above relative to FIGS. 26-29, in that the active bonding contacts 402 and ground contacts 434 are disposed outside of the cap metal patterns 432. Otherwise, fabrication and assembly techniques are the same as those described above with reference to FIGS. 26-29.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

The invention claimed is:

1. A method of forming a capped chip, said method comprising:
   forming a metal base pattern on a front surface of a chip;
   forming a cap, including:
      providing a mandrel having a depression formed in a surface thereof,
      applying an insulating coating atop said surface of said mandrel,
      removing a portion of said insulating coating to expose a region of said surface, the exposed region including the depression, and
      forming a metal layer atop only the exposed region of said surface including the depression; and
   joining said cap to said metal base pattern on said chip to form a capped chip such that said front surface of said chip remains uncovered from at least a contact of said chip to a peripheral edge of said chip.

2. A method as claimed in claim 1, further comprising: forming a conductive contact to said contact of said chip, said conductive contact extending vertically from said contact of said chip to provide a contact surface at an exposed plane that is located above said front surface of said chip.

3. The method of claim 1, further comprising: removing, after joining said cap to said metal, said mandrel to expose said front surface from said contact to said peripheral edge of said chip.

4. The method of claim 3, wherein said mandrel includes a low adhesion metal, and said removing step includes applying a force to separate said mandrel from said cap.

5. The method of claim 1, wherein said step of forming said cap includes concurrently forming a plurality of said caps, arranged in an array, on said mandrel, and said joining step includes disposing said plurality of said caps over an area encompassing a plurality of said chips, and concurrently joining said plurality of chips said plurality of caps to form a plurality of said capped chips.

6. A method of forming an assembly, said method comprising:
    forming a capped chip according to a method as claimed in claim 1;
    providing an encapsulant over said front surface of said chip; and
    providing a conductive connector extending between said contact of said capped chip and a top surface of said encapsulant.

7. A method of forming an assembly, said method comprising:
    forming a capped chip according to a method as claimed in claim 1; and
    conductively interconnecting said contact of said capped chip to a microelectronic element disposed above said capped chip.

8. A method as claimed in claim 7, wherein said microelectronic element includes at least one selected from the group consisting of a chip carrier, a circuit panel, a lead frame, and a substrate.

9. The method of claim 1, wherein said coating is an insulating coating, and said step of forming said metal layer includes electroplating said metal atop the exposed region of said mandrel.

10. The method of claim 1, wherein said step of forming said metal layer includes forming a first metal layer atop the exposed region of said mandrel, and forming a second metal layer atop said first metal layer.

11. The method of claim 1, wherein said joining step includes heating said mandrel and said chip to a desired temperature, and said mandrel and said chip have substantially same coefficients of thermal expansion (CTE).

12. The method of claim 1, wherein said joining step includes heating said mandrel and said chip to a desired temperature, said mandrel and said chip have different coefficients of thermal expansion (CTE), and said mandrel is sized such that said cap is aligned with said chip at the desired temperature.

13. The method of claim 1, wherein said joining step includes heating said mandrel and said chip to a desired temperature, said mandrel and said cap having different coefficients of thermal expansion (CTE) such that said mandrel separates from said metal layer while cooling down after said heating step is carried out.

14. A method of forming a capped chip, said method comprising:
    forming a respective metal base pattern on a front surface of each one of a plurality of chips, said plurality of chips being arranged according to a given array;
    patterning a metal sheet to form a cap frame that includes a plurality of caps, arranged according to the given array; and
    concurrently joining each one of said plurality of caps to corresponding ones of said plurality of chips to form a plurality of capped chips such that the front surface of each one of a plurality of chips remains uncovered from at least a contact of that chip to a peripheral edge of that chip.

15. The method of claim 14, further comprising: severing said plurality of capped chips from said cap frame concurrently with severing said plurality of chips.

16. A method of forming an assembly, said method comprising:
    forming a plurality of capped chips according to a method as claimed in claim 14;
    providing an encapsulant over a front surface of said plurality of capped chips; and
    providing a conductive connector extending between said contact of each chip and a top surface of said encapsulant.

17. A method of forming an assembly, said method comprising:
    forming a plurality of capped chips according to a method as claimed in claim 14; and
    conductively interconnecting said contact of each capped chip to an associated microelectronic element disposed above that chip.

18. A method as claimed in claim 17, wherein said microelectronic element includes at least one selected from the group consisting of a chip carrier, a circuit panel, a lead frame, and a substrate.

* * * * *